(12) United States Patent  
Tsuruhata et al.

(10) Patent No.: US 7,265,616 B2
(45) Date of Patent: Sep. 4, 2007

(54) CHARGE AMPLIFIER

(75) Inventors: Takao Tsuruhata, Oobu (JP); Hajime Ito, Aichi-ken (JP)

(73) Assignee: DENSO CORPORATION, Kariya (JP)

( * ) Notice: Subject to any disclaimer, the term of this patent is extended or adjusted under 35 U.S.C. 154(b) by 142 days.

(21) Appl. No.: 11/253,802

(22) Filed: Oct. 20, 2005

(65) Prior Publication Data
US 2006/0087370 A1  Apr. 27, 2006

(30) Foreign Application Priority Data
Oct. 22, 2004  (JP) .............................. 2004-308195

(51) Int. Cl.
*H03F 1/36* (2006.01)
(52) U.S. Cl. ........................................ 330/86; 330/282
(58) Field of Classification Search ...................... None
See application file for complete search history.

(56) References Cited
U.S. PATENT DOCUMENTS 6,396,934 B1 *  5/2002  Federspiel ................. 330/282

6,825,717 B2 *  11/2004  Dettmann ...................... 330/86

OTHER PUBLICATIONS

"Single-Chip Surface Micromachined Integrated Gyroscope With 50°/h Allan Deviation" written by John A. Geen et al.; IEEE Journal of Solid-State Circuits, vol. 37, No. 12; Dec. 2002; pp. 1860-1866.

* cited by examiner

*Primary Examiner*—Khanh Van Nguyen
(74) *Attorney, Agent, or Firm*—Posz Law Group, PLC

(57) ABSTRACT

In a charge amplifier, an operational amplifier is provided. The operational amplifier has an inverting input terminal, a non-inverting input terminal, and an output terminal. An adjustable feedback resistor element is provide to be connected between the inverting terminal and the output terminal. A resistance adjusting circuit is provided to be electrically connected to the adjustable feedback resistor element. The resistance adjusting circuit adjusts the resistance of the adjustable feedback resistor element to a first resistance during a first predetermined period after power-on. The resistance adjusting circuit also adjusts the resistance of the adjustable feedback resistor element to a second resistance after the first predetermined period has elapsed. The second resistance is higher than the first resistance.

6 Claims, 2 Drawing Sheets

CHARGE AMPLIFIER

CROSS REFERENCE TO RELATED APPLICATIONS

This application is based on Japanese Patent Application 2004-308195 filed on Oct. 22, 2004. This application claims the benefit of priority from the Japanese Patent Application, so that the descriptions of which are all incorporated herein by reference.

FIELD OF THE INVENTION

The present invention relates to charge amplifiers that convert a charge input signal from a sensor, such as a gyroscope, into an output voltage.

BACKGROUND OF THE INVENTION

A conventional example of microgyroscopes with a gyroscope and a signal processing circuit for processing a signal outputted therefrom, which are integrated in a single semiconductor chip, is disclosed in John A. Geen et al. "Single-chip Surface Micromachined Integrated Gyroscope With 50° C./h Allan Deviation" IEEE Journal of Solid-State Circuits, Vol. 37, No. 12, December 2002.

The microgyroscope disclosed in the document is provided with a charge amplifier configured to convert a charge signal outputted from a gyroscope into an output voltage. The charge amplifier includes an operational amplifier and a feedback resistor with a high resistance of the order of, for example, 500 MΩ; this high resistance is required to stabilize the output voltage of the operational amplifier.

As a feedback resistor with such a high resistance, which is to be installed in a single semiconductor chip as an Integrated Circuit (IC), a MOS resistor, that is, a MOSFET (Field Effect Transistor) with an adjustable high on-resistance, has been used in common. This is because the MOSFET can provide an adjustable high resistance with its compact size.

In the conventional charge amplifier with the structure set forth above for gyroscopes, because of the feedback MOS resistor's high resistance, the period required for the output of the charge amplifier to become stable after power-on thereof may become long. In other words, in the conventional charge amplifier with the structure set forth above, the period required for the charge amplifier to begin to self oscillate after power-on thereof may become long.

Specifically, after power on of the charge amplifier, an input offset component with respect to a reference voltage applied to the non-inverting input terminal of the operational amplifier is amplified thereby to be fed back as a feedback signal to the inverting input terminal of the operational amplifier through the feedback resistor. The feedback signal component is amplified by the operational amplifier to be fed back as a feedback signal to the inverting input terminal of the operational amplifier through the feedback resistor again. The repeated feedback through the feedback resistor allows the charge amplifier to gradually begin to self oscillate with respect to the reference voltage.

In this case, the lower the resistance of the feedback MOS resistor is, the shorter the period required for the charge amplifier to start to self oscillate can be. This MOS resistor's resistance lowering means may however cause the converting characteristic of the charge amplifier to deteriorate. In other words, the MOS resistor's resistance lowering means may cause the output voltage of the charge amplifier to become unstable. This may be because, the lower the resistance of the feedback resistor is, the larger the magnitude of the feedback signal flowing through the feedback resistor is.

SUMMARY OF THE INVENTION

The present invention has been made on the background above.

Accordingly, at least one preferable embodiment of the present invention provides a charge amplifier capable of keeping short the period required for the charge amplifier to begin to self oscillate.

According to one aspect of the present invention, there is provided a charge amplifier for converting a charge signal into an output voltage. The charge amplifier includes an operational amplifier having an inverting input terminal, a non-inverting input terminal, and an output terminal. The charge amplifier includes an adjustable feedback resistor element connected between the inverting terminal and the output terminal, and a resistance adjusting circuit electrically connected to the adjustable feedback resistor element. The charge amplifier is configured to adjust the resistance of the adjustable feedback resistor element to a first resistance during a first predetermined period after power-on; and to adjust the resistance of the adjustable feedback resistor element to a second resistance after the first predetermined period has elapsed, the second resistance being higher than the first resistance.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the present invention will be described hereinafter with reference to the accompanying drawings.

First Embodiment

Figure 1:
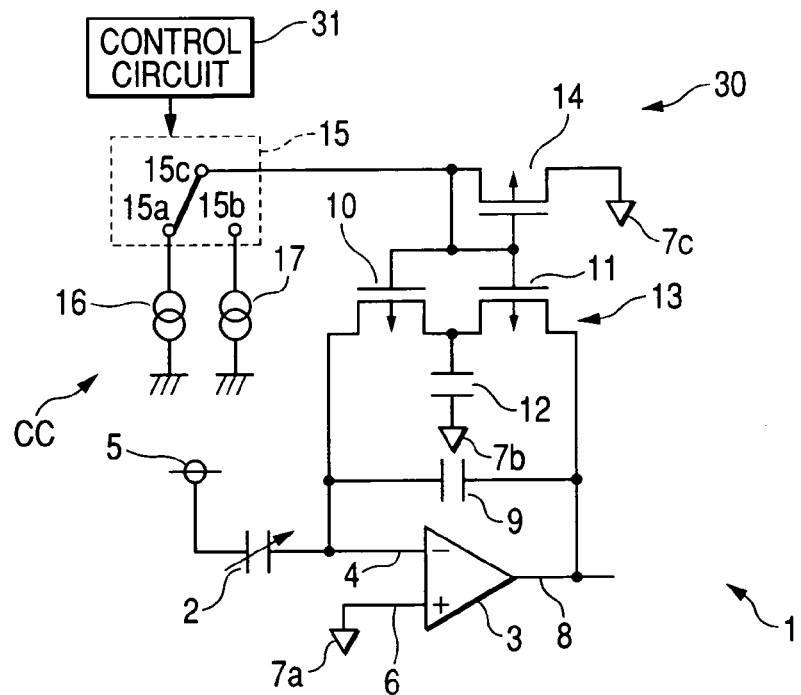
FIG. 1 is an electric circuit diagram illustrating an example of the structure of a charge amplifier for a gyroscope according to a first embodiment of the present invention.

FIG. 1 is an electric circuit diagram illustrating an example of the structure of a charge amplifier 1 for a gyroscope 2 according to a first embodiment of the present invention. For example, the gyroscope 2 is provided with a resonator vibrating in a plane based on a voltage applied thereto and with a sensor.

When the resonator is subjected to a rotation about an axis perpendicular to the plane, Coriolis acceleration is generated. The generated Coriolis acceleration is sensed by the sensor as a charge signal. The charge amplifier 1 is operative to convert the charge signal sent from the gyroscope 2 into a voltage output.

Specifically, as illustrated in FIG. 1, the charge amplifier 1 is provided with an operational amplifier 3 having an inverting input terminal 4, a non-inverting input terminal 6, and an output terminal 8. To the inverting terminal 4, an output terminal of the gyroscope 2 is electrically connected. An input terminal of the gyroscope 2 is electrically connected to a direct current (DC) constant voltage terminal 5. The constant DC voltage terminal 5 allows a predetermined constant DC voltage of, for example, 16 Volts (V) to be applied to the gyroscope 2.

The charge amplifier 1 is also provided with a constant DC voltage terminal 7a electrically connected to the non-inverting input terminal 6 thereof. The constant DC voltage terminal 7a permits a predetermined constant DC voltage of, for example, Vcc/2 (V), to be applied to the non-inverting input terminal 6; this DC voltage Vcc is, for example, a power supply voltage supplied to the charge amplifier 1.

The charge amplifier 1 is further provided with a feedback capacitor 9 connected between the inverting terminal 4 and the output terminal 8.

In addition, the charge amplifier 1 is provided with two PMOS transistors (PMOSFETs) 10 and 11. The PMOSFETs 10 and 11 are electrically connected to each other in series. Specifically, the source of the PMOSFET 10 is electrically connected to the drain of the PMOSFET 11. The source of the PMOSFET 11 is electrically connected to the output terminal 8 of the operational amplifier 3, and the drain of the PMOSFET 10 is electrically connected to the inverting terminal 4 of the operational amplifier 3. That is, the set of series connected PMOSFETs 10 and 11 is connected between the inverting terminal 4 and the output terminal 8 in parallel to the feedback capacitor 9.

The intermediate connecting point between the source of the PMOSFET 10 and the drain of the PMOSFET 11 is electrically connected through a capacitor 12 to a constant DC voltage terminal 7b. The constant DC voltage terminal 7b allows a predetermined constant DC voltage of, for example, Vcc/2 (V) to be applied to the intermediate connecting point. The capacitor 12 and the constant DC voltage terminal 7b can prevent the output voltage of the charge amplifier 1 from being unstable.

Specifically, the set of PMOSFETs 10 and 11 provides a feedback MOS resistor 13 with an adjustable feedback resistance corresponding to the sum of an on-resistance of the PMOSFET 10 and that of the PMOSFET 11.

In the structure of the charge amplifier 1, when the charge signal (charge) outputted from the gyroscope 2 is represented as "Qs", the capacitance of the feedback capacitor 9 is represented as "Cf", and the output voltage of the charge amplifier 1 is represented as "Vout", the output voltage Vout is given by the following equation:

$$Vout = \frac{Q_s}{Cf}$$

Still furthermore, the charge amplifier 1 is provided with a resistance adjusting circuit 30.

Specifically, as illustrated in FIG. 1, the resistance adjusting circuit 30 includes a PMOSFET 14 as an example of resistance control transistors. The source and gate of the PMOSFET 14 are electrically connected to the gate of each of the PMOSFETs 10 and 11. The resistance adjusting circuit 30 also includes a constant DC voltage terminal 7c connected to the source of the PMOSFET 14. The constant DC voltage terminal 7c allows a predetermined constant DC voltage of, for example, Vcc/2 (V) to be applied to the source of the PMOSFET 14.

The resistance adjusting circuit 30 is further provided with a selector switch 15 having a first contact 15a, a second contact 15b, and a common contact 15c. The selector switch 15 allows electrical connection of the common contact 15c with any one of the first and second contacts 15a and 15b based on control signals sent from a control circuit 31 described hereinafter. The common contact 15c is electrically connected to the drain of the PMOSFET 14.

The resistance adjusting circuit 30 is provided with a first constant-current source 16 with two terminals and a second constant-current source 17 with two terminals. The first and second constant-current sources 16 and 17 constitute constant-current circuitry CC according to the first embodiment.

The first contact 15a is electrically connected to one of the terminals of the first constant-current source 16, and the second contact 15b is electrically connected to one of the terminals of the constant-current source 17. The other of the terminals of the first constant-current source 16 and that of the terminals of the second constant-current source 17 are grounded.

In addition, the resistance adjusting circuit 30 is provided with a control circuit 31 electrically connected to the selector switch 15. The control circuit 31 is configured to send, to the selector switch 15, the control signals that cause the selector switch 15 to select any one of the first and second contacts 15a and 15b and to establish electrical connection of the common contact 15c with the selected one of the first and second contacts 15a and 15b.

When the selector switch 15 selects the first contact 15a to establish electrical connection of the common contact 15c with the selected first contact 15a based on the control signal sent from the control circuit 31, the first constant-current source 16 is electrically conducted to the PMOSFET 14.

In the state of the electrical conduction between the first constant-current source 16 and the PMOSFET 14, the feedback resistance of the feedback MOS resistor 13 is configured to be set to a first resistance of, for example, 50 Megohm (MΩ) or thereabout; this first resistance is lower than a second resistance of, for example, the order of 500 MΩ required to stabilize the voltage output of the operational amplifier 1.

Specifically, when the first constant-current source 16 is electrically conducted to the PMOSFET 14, a first constant current whose constant value previously determined by the first constant-current source 16 flows from the DC voltage terminal 7c through the PMOSFET 14 and the first constant-current source 16 into the ground. The value of the first constant current flowing through the PMOSFET 14 determines the gate voltage of the PMOSFET 14 so that the determined gate voltage is applied to the gate of each of the PMOSFETs 10 and 11. The voltage applied to the gate of each of the PMOSFETs 10 and 11 determines the on-resistance of each of the PMOSFETs 10 and 11 so that the feedback resistance of the feedback MOS resistor 13 is determined as the sum of the on-resistance of the PMOSFET 10 and that of the PMOSFET 11.

That is, in the first embodiment, the feedback resistance of the feedback MOS resistor 13 depends on the value (magnitude) of the first constant current flowing through the PMOSFET 14; this value of the first constant current has been determined by the first constant-current source 16. In the first embodiment, the value of the first constant current flowing through the PMOSFET 14 has been determined by the first constant-current source 16 such that the feedback resistance of the feedback MOS resistor 13 has been set to the first resistance of 50 MΩ or thereabout.

In contrast, when the selector switch 15 selects the second contact 15b to establish electrical connection of the common contact 15c with the selected second contact 15b based on the control signal sent from the control circuit 31, the second constant-current source 17 is electrically conducted to the PMOSFET 14.

In the state of the electrical connection between the second constant-current source 17 and the PMOSFET 14, the feedback resistance of the feedback MOS resistor 13 is configured to be set to the second resistance of, for example, 500 MΩ or thereabout, which is higher than the first resistance.

Specifically, when the second constant-current source 17 is electrically conducted to the PMOSFET 14, a second constant current whose value previously determined by the second constant-current source 17 flows from the DC voltage terminal 7c through the PMOSFET 14 and the second constant-current source 17 into the ground. The second constant current flowing through the PMOSFET 14 determines the gate voltage of the PMOSFET 14 so that the determined gate voltage is applied to the gate of each of the PMOSFETs 10 and 11. The gate voltage applied to the gate of each of the PMOSFETs 10 and 11 determines the on-resistance of each of the PMOSFETs 10 and 11 so that the feedback resistance of the feedback MOS resistor 13 is determined as the sum of the on-resistance of the PMOSFET 10 and that of the PMOSFET 11.

That is, in the first embodiment, the feedback resistance of the feedback MOS resistor 13 depends on the value (magnitude) of the second constant current flowing through the PMOSFET 14: this value of the second constant current has been determined by the second constant-current source 17. In the first embodiment, the value of the second constant current flowing through the PMOSFET 14 has been determined by the second constant-current source 17 such that the feedback resistance of the feedback MOS resistor 13 has been set to the second resistance of 500 MΩ or thereabout.

Still furthermore, the charge amplifier 1 is provided with a single chip in/on which all of the components of the charge amplifier 1 including the operational amplifier 3, the feedback capacitor 9, the PMOSFETs 10 and 11, and the resistance adjusting circuit 30, and electric wiring therebetween are integrated.

Operations of the charge amplifier 1 according to the first embodiment will be described hereinafter.

Before power on of the charge amplifier 1, the selector switch 15 is configured to select the first contact 15a to establish electrical connection of the common contact 15c with the selected first contact 15a so that the first constant-current source 16 is electrically conducted to the PMOSFET 14. In the state of the electrical conduction between the first constant-current source 16 and the PMOSFET 14, the feedback resistance of the feedback MOS resistor 13 is configured to be set to the first resistance of 50 MΩ or thereabout.

In the state of the electrical connection between the first constant-current source 16 and the PMOSFET 14, after power on of the charge amplifier 1, because the feedback resistance of the feedback MOS resistor 13 has been set to the first resistance of approximately 50 MΩ, which is lower than the second resistance of 500 MΩ, the charge amplifier 1 begins to self oscillate in a predetermined period.

After the predetermined period has elapsed since power on of the charge amplifier 1, the selector switch 15 is configured to switch electrical connection of the common contact 14c from the first contact 15a to the second contact 15b so that the second constant-current source 17 is electrically conducted to the PMOSFET 14. In the state of the electrical conduction between the second constant-current source 17 and the PMOSFET 14, the feedback resistance of the feedback MOS resistor 13 is configured to be set to the second resistance of 500 MΩ or thereabout.

In the state of the electrical connection between the second constant-current source 17 and the PMOSFET 14, because the feedback resistance of the feedback MOS resistor 13 has been set to the high resistance of approximately 500 MΩ, which is required to stabilize the output voltage of the charge amplifier 1, the converting characteristic of the charge amplifier 1 becomes stable.

As described above, in the first embodiment, the charge amplifier 1 is configured to set the feedback resistance of the feedback MOS resistor 13 to a comparatively low resistance of, for example, 50 MΩ during the predetermined period required for the charge amplifier 1 to begin to self oscillation after power on thereof. In addition, after the predetermined period has elapsed since power on of the charge amplifier 1, the charge amplifier 1 is configured to set the feedback resistance of the feedback MOS resistor 13 to a comparatively high resistance of, for example, 500 MΩ; this resistance is higher than the previously set resistance of, for example, 50 MΩ and is required to stabilize the output of the charge amplifier 1.

This charge amplifier's configuration makes it possible to shorten the length of the period for the charge amplifier 1 to begin to self oscillate after power on thereof while keeping the output of the charge amplifier 1 stable at the same level as, for example, the conventional charge amplifier set forth above.

The inventors of the present invention carried out to measure the period required for the charge amplifier 1 according to the first embodiment to begin to self oscillate after power on thereof. The measurement result was around 0.5 seconds. In contrast, the inventors of the present invention also carried out to measure the period required for the conventional charge amplifier with the feedback resistor whose resistance is the order of 500 MΩ to begin to self oscillate after power on thereof. The measurement result was around 2-3 seconds. These measurement results clearly show that the period required for the charge amplifier 1 according to the first embodiment to begin to self oscillate after power on thereof is shorter than that for the conventional charge amplifier with the feedback resistor whose resistance is the order of 500 MΩ to begin to self oscillate after power on thereof.

In addition, in the first embodiment, the charge amplifier 1 is configured to change the value of the current to be supplied to the PMOSFET 14; this current value determines the feedback resistance of the feedback MOS resistor 13.

Specifically, in the first embodiment, the resistance adjusting circuit 30 of the charge amplifier 1 is provided with the first and the second constant-current sources 16 and 17 as the constant-current circuitry CC. In addition, the resistance adjusting circuit 30 is provided with the selector switch 15 configured to select electrical connection of the PMOSFET 14 with any one of the first and second constant-current sources 16 and 17.

The charge amplifier 1 with the structure set forth above makes it possible to simply realize the configuration to change the value of the current of the constant-current circuitry CC flowing through the PMOSFET 14, in other words, the configuration to change the feedback resistance of the feedback PMOSFET 13.

Note that, in the first embodiment, the charge amplifier 1 is designed to use the first and second constant-current sources 16 and 17 as the constant-current circuitry CC, but the present invention is not limited to the structure.

Specifically, the charge amplifier 1 can use three or more constant-current sources having constant-current values different from each other as the constant-current circuitry CC; these constant-current values correspond to different feedback resistances of the feedback MOS resistor 13. In this modification, the selector switch 15 can be configured to select electrical connection of the PMOSFET 14 with any one of the three or more constant-current sources.

In another modification, the constant-current circuitry CC can have a function of changing the value of the current of the constant-current circuitry flowing through the PMOSFET 14 to meet desirable feedback resistances of the feedback PMOSFET 13.

Second Embodiment

Figure 2:
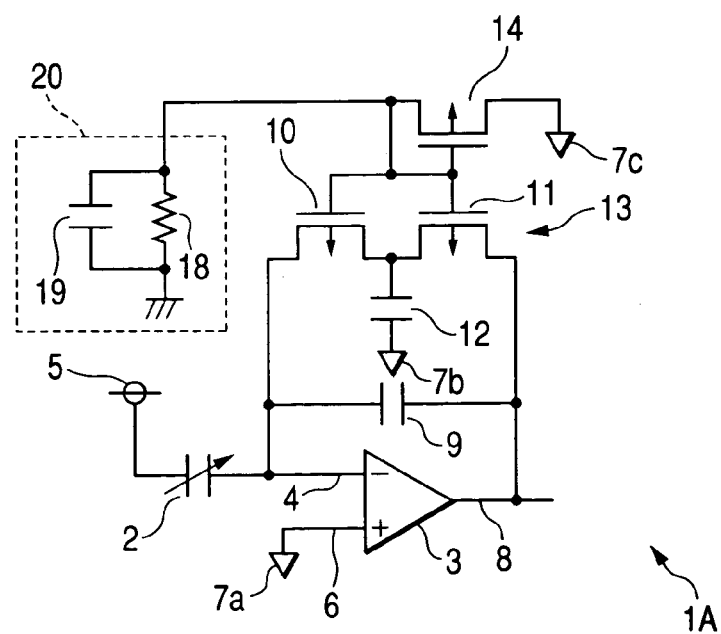
FIG. 2 is an electric circuit diagram illustrating an example of the structure of a charge amplifier for a gyroscope according to a second embodiment of the present invention.

FIG. 2 is an electric circuit diagram illustrating an example of the structure of a charge amplifier 1A for the gyroscope 2 according to a second embodiment of the present invention. Note that elements of the charge amplifier 1A according to the second embodiment, which are substantially identical to those of the charge amplifier 1 according to the first embodiment shown in FIG. 1, are represented by the same reference characters as in FIG. 1.

The charge amplifier 1A according to the second embodiment is provided with a time-constant circuit 20 as the constant-current circuitry CC according to the first embodiment. That is, the time-constant circuit 20 serves as the constant-current circuitry CC.

Specifically, the time-constant circuit 20 is provided with a resistor 18 with a predetermined resistance R and a capacitor 19 with a predetermined capacitance C; these resistor 18 and the capacitor 19 are connected to each other in parallel. The time-constant circuit 20 has two terminals, one of which is electrically connected to the drain of the PMOSFET 14; the other thereof is grounded.

In the configuration of the charge amplifier 1A, after power on of the charge amplifier 1A, a first current whose value is high flows from the DC voltage terminal 7c through the PMOSFET 14 and the time-constant circuit 20 into the ground. As well as the first embodiment, the value of the first current has been determined based on the predetermined constant DC voltage applied to the source of the PMOSFET 14 from the constant DC voltage terminal 7c such that the feedback resistance of the feedback MOS resistor 13 has been set to a third resistance of 50 MΩ or thereabout.

After the charge of the capacitor 19 of the time-constant circuit 20 has been completed, the time-constant circuit 20 allows a constant second current whose value is lower than that of the first current to flow therethrough and the PMOSFET 14. This is because the capacitor 19 is fully charged so that the second current only flows through the resistor 18.

In the second embodiment, the time-constant CR of the time-constant circuit 20 determines the constant value of the second current such that the feedback resistance of the feedback MOS resistor 13 has been set to a fourth resistance of 500 MΩ or thereabout; this fourth resistance is higher than the previously set resistance of, for example, 50 MΩ and is required to stabilize the output voltage of the charge amplifier 1A.

For example, the period required for the capacitor 19 of the time-constant circuit 20 to be charged is substantially equivalent to that required for the charge amplifier 1A to begin to self oscillation after power on thereof.

As described above, in the second embodiment, the charge amplifier 1A is configured to set the feedback resistance of the feedback MOS resistor 13 to a comparatively low resistance of, for example, 50 MΩ during the period required for the charge amplifier 1A to begin to self oscillate after power on thereof. In addition, after the period has elapsed since power on of the charge amplifier 1A, the charge amplifier 1A is configured to set the feedback resistance of the feedback MOS resistor 13 to a comparatively high resistance of, for example, 500 MΩ, which is higher than the previously set resistance of, for example, 50 MΩ and is required to stabilize the output voltage of the charge amplifier 1A.

This charge amplifier's configuration makes it possible for the charge amplifier 1A to begin to self oscillate in a short period after power on of the charge amplifier 1A while keeping the output of the charge amplifier 1A stable at the same level as, for example, the conventional charge amplifier set forth above.

Third Embodiment

Figure 3:
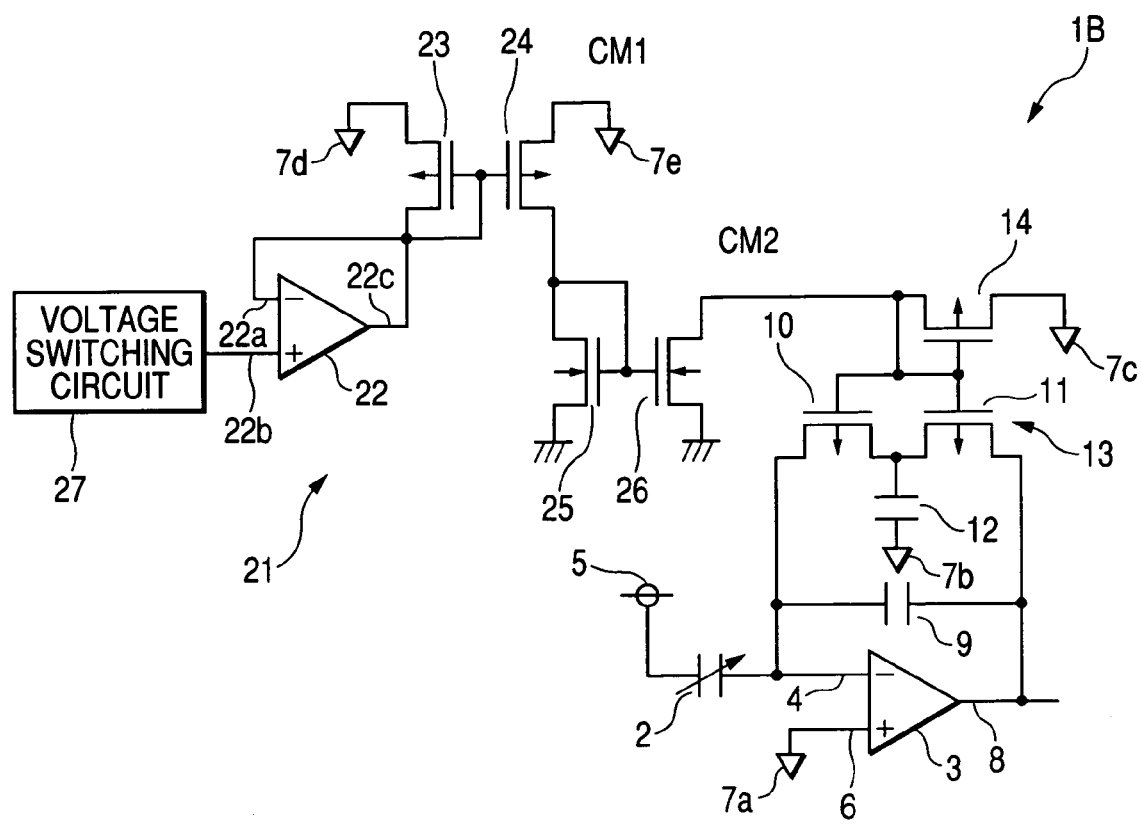
FIG. 3 is an electric circuit diagram illustrating an example of the structure of a charge amplifier for a gyroscope according to a third embodiment of the present invention.

FIG. 3 is an electric circuit diagram illustrating an example of the structure of a charge amplifier 1B for the gyroscope 2 according to a third embodiment of the present invention. Note that elements of the charge amplifier 1B according to the third embodiment, which are substantially identical to those of the charge amplifier 1 according to the first embodiment shown in FIG. 1, are represented by the same reference characters as in FIG. 1.

The charge amplifier 1B according to the third embodiment is provided with a constant current circuit 21 as the constant-current circuitry CC according to the first embodiment. That is, the constant current circuit 21 serves as the constant-current circuitry CC.

Specifically, the constant current circuit 21 is provided with an operational amplifier 22 having an inverting input terminal 22a, a non-inverting input terminal 22b, and an output terminal 22c. The constant current circuit 21 is also provided with a first current mirror circuit CM1, a second current mirror circuit CM2, and a voltage switching circuit 27.

The first current mirror circuit CM1 includes, as two transistors, PMOSFETs 23 and 24 such that their gates are electrically connected in common to each other, and that the drain of the PMOSFET 23 is electrically connected to the common base of each of the PMOSFET 23 and 24.

The drain of the PMOSFET 23 is electrically connected to both the inverting input terminal 22a and the output terminal 22c of the operational amplifier 22 so that the inverting input terminal 22a and the output terminal 22c are electrically connected to each other. This electrical connection allows the operational amplifier 22 to serve as a voltage follower (buffer). The non-inverting input terminal 22b is electrically connected to the voltage switching circuit 27.

The constant current circuit 21 is provided with a constant DC voltage terminal 7d electrically connected to the source of the PMOSFET 23. The constant DC voltage terminal 7d allows a predetermined constant DC voltage of, for example, Vcc/2 (V), to be applied to the source of the PMOSFET 23. Moreover, the constant current circuit 21 is provided with a constant DC voltage terminal 7e electrically connected to the source of the PMOSFET 24. The constant DC voltage terminal 7e allows a predetermined constant DC voltage of, for example, Vcc/2 (V), to be applied to the source of the PMOSFET 24.

The second current mirror circuit CM2 includes, as two transistors, NMOSFETs 25 and 26 such that their gates are electrically connected in common to each other, and that the drain of the NMOSFET 25 is electrically connected to the common base of each of the NMOSFET 25 and 26.

The drain of the NMOSFET 25 of the second current mirror circuit CM2 is electrically connected to the drain of the PMOSFET 24 of the first current mirror circuit CM1. Each source of each of the NMOSFETs 25 and 26 is grounded. The drain of the NMOSFET 26 is electrically connected to the drain of the PMOSFET 14.

In the configuration of the charge amplifier 1B, after power on of the charge amplifier 1B, the voltage switching circuit 27 has applied a predetermined first voltage to the non-inverting terminal 22b of the operational amplifier 22 for a predetermined period. For example, the predetermined period is substantially equivalent to a period required for the charge amplifier 1B to begin to self oscillation after power on thereof.

Because the operational amplifier 22 serves as a voltage follower, the first voltage applied to the non-inverting terminal 22b of the operational amplifier 22 appears at the output terminal 22c of the operational amplifier 22. The first voltage at the output terminal 22c of the operational amplifier 22 is applied to the drain of the PMOSFET 23. The first voltage applied to the drain of the PMOSFET 23 determines a first drain current of the PMOSFET 23.

Because the PMOSFETs 23 and 24 constitute current mirror configuration, the first drain current flows from the source of the PMOSFET 24 to the drain thereof so that the first drain current flows through the drain and source of the NMOSFET 25 into the ground. Because the NMOSFETs 25 and 26 constitute current mirror configuration, the first drain current flowing through the drain and source of the NMOSFET 25 into the ground appears to flow from the constant DC voltage terminal 7c through the PMOSFET 14 and the NMOSFET 26 into the ground.

As well as the first embodiment, the first drain current flowing through the PMOSFET 14 determines the gate voltage of the PMOSFET 14 so that the determined gate voltage is applied to the gate of each of the PMOSFETs 10 and 11. The gate voltage applied to the gate of each of the PMOSFETs 10 and 11 determines the on-resistance of each of the PMOSFETs 10 and 11 so that the feedback resistance of the feedback MOS resistor 13 is determined as the sum of the on-resistance of the PMOSFET 10 and that of the PMOSFET 11.

That is, in the third embodiment, the feedback resistance of the feedback MOS resistor 13 depends on the value (magnitude) of the first drain current flowing through the PMOSFET 14. The value of the first drain current-has been determined based on the first voltage applied to the non-inverting input terminal 22b of the operational amplifier 22 by the voltage switching circuit 27.

In the third embodiment, the value of the first drain current flowing through the PMOSFET 14 has been determined based on the first voltage applied to the non-inverting input terminal 22b of the operational amplifier 22 by the voltage switching circuit 27 such that the feedback resistance of the feedback MOS resistor 13 has been set to a fifth resistance of 50 MΩ or thereabout.

After the predetermined period has elapsed since power on of the charge amplifier 1B, the voltage switching circuit 27 applies a predetermined second voltage to the non-inverting terminal 22b of the operational amplifier 22. As described above, the second voltage applied to the non-inverting terminal 22b of the operational amplifier 22 appears at the output terminal 22c of the operational amplifier 22 to be applied to the drain of the PMOSFET 23. The second voltage applied to the drain of the PMOSFET 23 determines a second drain current of the PMOSFET 23.

The second drain current flows through the drain and source of the NMOSFET 25 into the ground so that it appears to flow from the constant DC voltage terminal 7c through the PMOSFET 14 and the NMOSFET 26 into the ground.

The second drain current flowing through the PMOSFET 14 therefore determines the gate voltage of the PMOSFET 14 so that the determined gate voltage is applied to the gate of each of the PMOSFETs 10 and 11. The gate voltage applied to the gate of each of the PMOSFETs 10 and 11 determines the on-resistance of each of the PMOSFETs 10 and 11 so that the feedback resistance of the feedback MOS resistor 13 is determined as the sum of the on-resistance of the PMOSFET 10 and that of the PMOSFET 11.

That is, in the third embodiment, the feedback resistance of the feedback MOS resistor 13 depends on the value of the second drain current flowing through the PMOSFET 14. The value of the second drain current has been determined based on the second voltage applied to the non-inverting input terminal 22b of the operational amplifier 22 by the voltage switching circuit 27.

In the third embodiment, the value of the second drain current flowing through the PMOSFET 14 has been determined based on the second voltage applied to the non-inverting input terminal 22b of the operational amplifier 22 by the voltage switching circuit 27 such that the feedback resistance of the feedback MOS resistor 13 has been set to a sixth resistance of 500 MΩ or thereabout; this sixth resistance is higher than the fifth resistance of 50 MΩ and is required to stabilize the output of the charge amplifier 1B.

As described above, in the third embodiment, the charge amplifier 1B is configured to set the feedback resistance of the feedback MOS resistor 13 to a comparatively low resistance of, for example, 50 MΩ during the predetermined period required for the charge amplifier 1B to begin to self oscillation after power on thereof. In addition, after the predetermined period has elapsed since power on of the charge amplifier 1B, the charge amplifier 1B is configured to set the feedback resistance of the feedback MOS resistor 13 to a comparatively high resistance of, for example, 500 MΩ; this resistance is higher than the previously set resistance of, for example, 50 MΩ and is required to stabilize the output of the charge amplifier 1B.

This charge amplifier's configuration makes it possible for the charge amplifier 1B to begin to self oscillate in a short period after power on of the charge amplifier 1B while maintaining the output of the charge amplifier 1B stable at the same level as, for example, the conventional charge amplifier set forth above.

In each of the first to third embodiments, the PMOSFETs 10 and 11 are used as the feedback resistor (MOS resistor 13), but the present invention is not limited to the structure. Specifically, as the feedback resistor of each of the charge amplifiers 1, 1A, and 1B, at least one resistance MOSFET (PMOSFET with an adjustable on-resistance or NMOSFET with an adjustable on-resistance) or another at least one variable (adjustable) resistor formed by, for example, an other type of transistor (resistance transistor) can be used.

For example, when using NMOSFETs in place of the PMOSFETS 10 and 11, the source of one of the NMOSFETs is electrically connected to the drain of the other thereof. The drain of the one of the NMOSFETs is electrically connected to the output terminal 8 of the operational amplifier 3, and the source of the other of the NMOSFETs is electrically connected to the inverting terminal 4 of the operational amplifier 3. The set of series connected NMOSFETs is connected between the inverting terminal 4 and the output terminal 8 in parallel to the feedback capacitor 9.

In addition, in each of the first to third embodiments, the PMOSFET 14 is used as the resistance control transistor, but the present invention is not limited to the structure.

Specifically, as the resistance control transistor, an NMOSFET or anther type of transistor, which is capable of controlling the adjustable resistance of the feedback resistor, such as the on-resistance of the MOS resistor 13, can be used.

Moreover, in each of the first to third embodiments, each of the charge amplifiers 1, 1A, and 1B is used to convert a charge input signal outputted from the gyroscope 2 into an output voltage, but the present invention is not limited to the structure. Specifically, charge amplifiers according to the present invention can be used to convert a charge input signal outputted from various types of sensors into an output voltage.

While there has been described what is at present considered to be these embodiments and modifications of the present invention, it will be understood that various modifications which are not described yet may be made therein, and it is intended to cover in the appended claims all such modifications as fall within the true spirit and scope of the invention.

What is claimed is:

1. A charge amplifier for converting a charge signal into an output voltage, the charge amplifier comprising:
   an operational amplifier having an inverting input terminal, a non-inverting input terminal, and an output terminal;
   an adjustable feedback resistor element connected between the inverting terminal and the output terminal; and
   a resistance adjusting circuit electrically connected to the adjustable feedback resistor element and configured to:
   adjust the resistance of the adjustable feedback resistor element to a first resistance during a first predetermined period after power-on; and
   adjust the resistance of the adjustable feedback resistor element to a second resistance after the first predetermined period has elapsed, the second resistance being higher than the first resistance.

2. A charge amplifier according to claim 1, wherein the adjustable feedback resistor element is formed by at least one resistance transistor with an on-resistance corresponding to the resistance of the adjustable feedback resistor, the on-resistance of the at least one resistance transistor being adjusted to any one of the first and second resistances based on control of the resistance adjusting circuit.

3. A charge amplifier according to claim 2, wherein the resistance transistor is a MOSFET, and the resistance adjusting circuit includes:
   a resistance control transistor electrically connected to the MOSFET; and
   constant current circuitry electrically connected to the resistance control transistor, and
   wherein the resistance control transistor allows control of the on-resistance of the MOSFET based on a constant current supplied thereto from the constant current circuitry so that the on-resistance of the MOSFET is adjusted to any one of the first and second resistances, a value of the constant current to be supplied to the resistance control transistor from the constant current circuitry being adjusted based on control of the resistance adjusting circuit.

4. A charge amplifier according to claim 3, wherein the constant current circuitry includes a first constant current source for supplying a first constant current, and a second constant current source for supplying a second constant current, the resistance adjusting circuit includes:
   a selector circuit electrically connected to the first constant current source, the second constant current source, and the resistance control transistor; and
   a control circuit electrically connected to the selector circuit, and the control circuit is configured to:
   cause the selector circuit to select the first constant current source and to connect the selected first constant current source to the resistance control transistor so that the first constant current is supplied to the MOSFET, the first constant current allowing the on-resistance of the MOSFET to be set to the first resistance; and
   cause the selector circuit to select the second constant current source and to connect the selected second constant current source to the resistance control transistor so that the second constant current is supplied to the MOSFET, the second constant current allowing the on-resistance of the MOSFET to be set to the second resistance.

5. A charge amplifier according to claim 3, wherein the constant current circuitry is a time-constant circuit, the time-constant circuit including a resistor and a capacitor electrically connected thereto in parallel, the time-constant circuit being electrically connected to the resistance control transistor, and
   the time constant circuit allows the constant current with a first value to flow through the resistance control transistor until the capacitor has been charged and allows the constant current with a second value to flow through the resistance control transistor after completion of the charge of the capacitor, and
   wherein the first value of the constant current flowing through the resistance control transistor allows the on-resistance of the MOSFET to be set to the first resistance, and the second value of the constant current flowing through the resistance control transistor allows the on-resistance of the MOSFET to be set to the second resistance.

6. A charge amplifier according to claim 3, wherein the constant current circuitry includes:
   an operational amplifier having an inverting input terminal, a non-inverting input terminal, and an output terminal;
   a first current mirror circuit with first and second transistors, the first transistor being electrically connected to both the inverting input terminal and the output terminal of the operational amplifier;
   a second current mirror circuit with third and fourth transistors, the third transistor being electrically connected to the second transistor of the first current mirror circuit, the fourth transistor being electrically connected to the resistance control transistor; and
   a voltage switching circuit electrically connected to the noninverting input terminal of the operational amplifier,
   during the first predetermined period after power-on, the voltage switching circuit applies a predetermined first voltage to the non-inverting terminal of the operational amplifier so that the first voltage appears at the output terminal thereof to be applied to the first transistor of the first current mirror circuit, the first voltage applied to the first transistor of the first current mirror circuit determining a first current therethrough, the first current mirror circuit causes the first current to flow through the second transistor so that the first current flows through the third transistor of the second current mirror circuit, and the second current mirror circuit causes the first current to flow through the fourth transistor and the resistance control transistor so that the first current flowing through the resistance control transistor allows the on-resistance of the MOSFET to be set to the first resistance, and wherein, after the first predetermined period has elapsed, the voltage switching circuit applies a predetermined second voltage to the non-inverting terminal of the operational amplifier so that the second voltage appears at the output terminal thereof to be applied to the first transistor of the first current mirror circuit, the second voltage applied to the first transistor of the first current mirror circuit determining a second current therethrough, the first current mirror circuit causes the second current to flow through the second transistor so that the second current flows through the third transistor of the second current mirror circuit, and the second current mirror circuit causes the second current to flow through the fourth transistor and the resistance control transistor so that the second current flowing through the resistance control transistor allows the on-resistance of the MOSFET to be set to the second resistance.

\* \* \* \* \*

UNITED STATES PATENT AND TRADEMARK OFFICE
CERTIFICATE OF CORRECTION

PATENT NO. : 7,265,616 B2 Page 1 of 1
APPLICATION NO. : 11/253802
DATED : September 4, 2007
INVENTOR(S) : Takao Tsuruhara and Hajime Ito It is certified that error appears in the above-identified patent and that said Letters Patent is hereby corrected as shown below:

Title page

Correct Item (12), as:  United States Patent
 "Tsuruhara" et al.

Correct Item (75), as Inventors:  Takao "Tsuruhara", Oobu (JP);
 Hajime Ito, Aichi-ken (JP)

Signed and Sealed this

Twenty-seventh Day of November, 2007

JON W. DUDAS
*Director of the United States Patent and Trademark Office*